(12) United States Patent
Yeon et al.

(10) Patent No.: US 11,081,534 B2
(45) Date of Patent: Aug. 3, 2021

(54) DISPLAY PANEL AND DISPLAY DEVICE

(71) Applicant: LG Display Co., Ltd., Seoul (KR)

(72) Inventors: DeukHo Yeon, Paju-si (KR);
TaeHyoung Moon, Paju-si (KR);
JaeHyun Kim, Paju-si (KR); SungJin Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/895,633

(22) Filed: Jun. 8, 2020

(65) Prior Publication Data
US 2020/0403045 A1 Dec. 24, 2020

(30) Foreign Application Priority Data

Jun. 19, 2019 (KR) .......................... 10-2019-0072886

(51) Int. Cl.
| | |
|---|---|
| *H01L 27/12* | (2006.01) |
| *H01L 27/32* | (2006.01) |
| *G09G 3/22* | (2006.01) |
| *G06K 9/00* | (2006.01) |

(52) U.S. Cl.
CPC ........ *H01L 27/3225* (2013.01); *G06K 9/0002* (2013.01); *G09G 3/22* (2013.01); *H01L 27/1214* (2013.01); *H01L 27/3276* (2013.01); *G09G 2300/0426* (2013.01); *G09G 2300/08* (2013.01); *H01L 2227/323* (2013.01); *H01L 2227/326* (2013.01)

(58) Field of Classification Search
CPC ............. H01L 27/3225; H01L 27/3276; H01L 2227/323; H01L 2227/326; H01L 27/1214; G06K 9/0002; G09G 3/22; G09G 2300/0426; G09G 2300/08
See application file for complete search history.

(56) References Cited

U.S. PATENT DOCUMENTS

2020/0257873 A1\* 8/2020 Heo .................... H01L 27/1214

\* cited by examiner

*Primary Examiner* — Abdul-Samad A Adediran
(74) *Attorney, Agent, or Firm* — Fenwick & West LLP

(57) ABSTRACT

Provided are a display panel and a display device. After deposition of a thin-film transistor layer and a display layer in which emitting devices are disposed, a sensing layer including a piezoelectric material is disposed under the thin-film transistor layer to facilitate implementation of a display panel having built-in piezoelectric devices. Further, as thin-film transistors for ultrasonic sensing and thin-film transistors for display driving are disposed in different layers, a display panel capable of ultrasonic sensing in an active area may be provided without affecting a display resolution or implementation of display pixels.

20 Claims, 13 Drawing Sheets

FIG.4
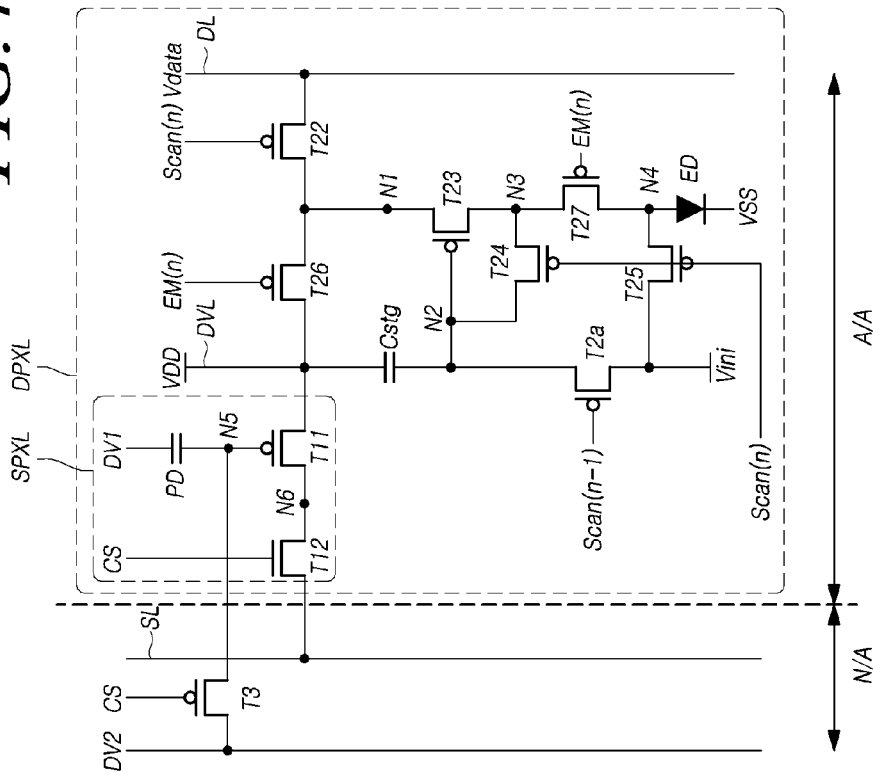
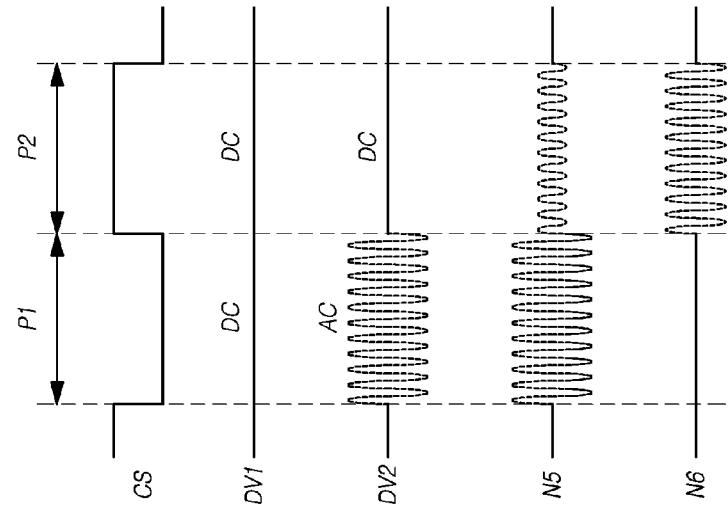

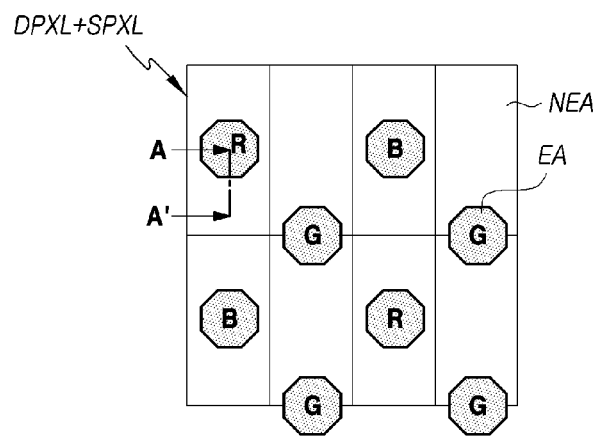
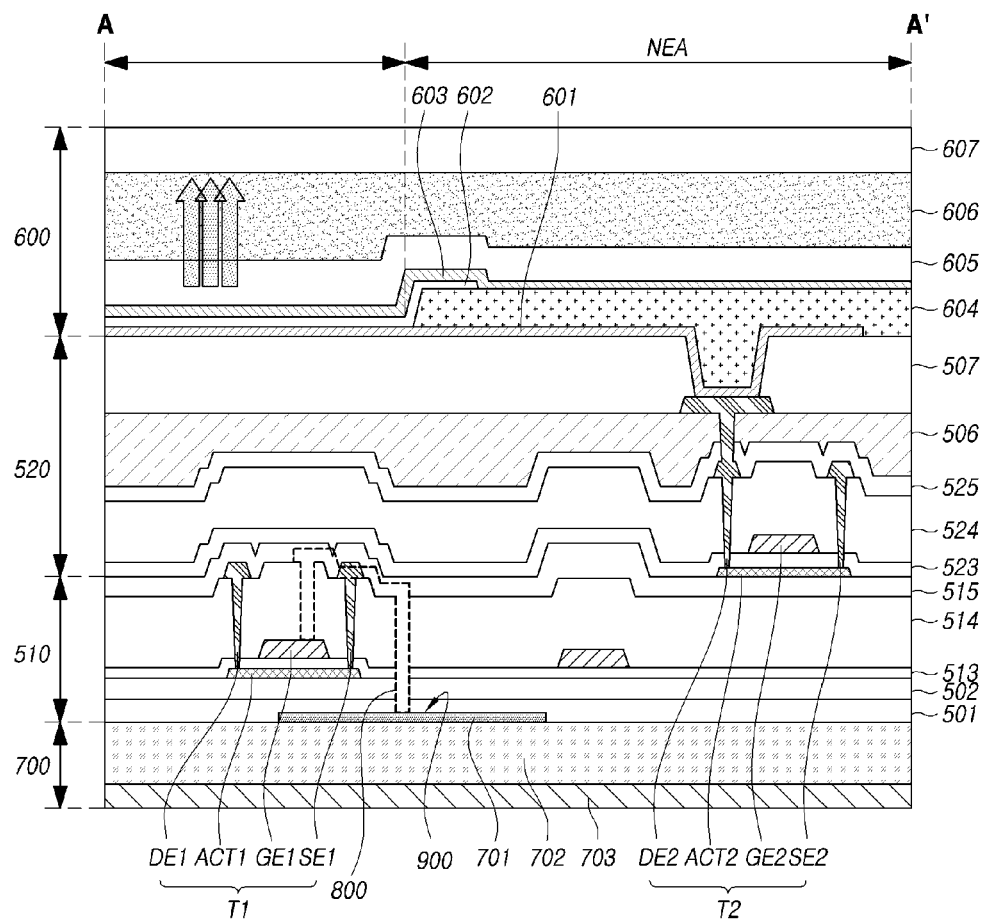
FIG. 7

<TFT deposition + OLED deposition: high-temperature process>

<Laser Lift Off>

<piezoelectric material deposition: low-temperature process>

DISPLAY PANEL AND DISPLAY DEVICE

CROSS REFERENCE TO RELATED APPLICATION

This application claims priority from Republic of Korea Patent Application No. 10-2019-0072886, filed on Jun. 19, 2019, which is hereby incorporated by reference in its entirety.

FIELD OF TECHNOLOGY

Embodiments of the present disclosure relate to a display panel and a display device.

BACKGROUND

Along with the development of the information society, demands for display devices that display images are growing. In this regard, various types of display devices, such as liquid crystal display (LCD) devices and organic light emitting diode (OLED) display devices, have been widely used.

To provide more diverse functions to users, such a display device recognizes a touch or biometric information (e.g., a fingerprint) of a user on a display panel and processes an input based on the recognized information.

For example, although optical sensors or the like may be arranged in the bezel area of the display panel to recognize biometric information of the user, the arrangement of the optical sensors in the bezel area may lead to reduction of the size of the active area of the display panel. Moreover, the implementation of the sensors in the active area may degrade sensing performance or affect display driving.

Accordingly, there is a need for a method of recognizing biometric information of a user who touches a display panel, while preventing reduction of the size of an active area in the display panel.

SUMMARY

Embodiments of the present disclosure provide a display panel and a display device, in which piezoelectric devices are built in the active area of the display panel and sensing may be performed using ultrasonic waves.

Embodiments of the present disclosure provide a method of facilitating implementation of a display panel including emitting devices and piezoelectric devices, while preventing reduction of the size of an active area which might otherwise be caused by arrangement of the piezoelectric devices.

According to an aspect, embodiments of the present disclosure provide a display panel including a thin-film transistor layer in which a plurality of first thin-film transistors and a plurality of second thin-film transistor are disposed, a display layer disposed on the thin-film transistor layer, in which a plurality of emitting devices are disposed, and a sensing layer disposed under the thin-film transistor layer.

The sensing layer may include a plurality of sensing pixel electrodes disposed on a bottom surface of the thin-film transistor layer, a piezoelectric material disposed under the sensing pixel electrodes, and a sensing common electrode disposed under the piezoelectric material.

At least one of the plurality of first thin-film transistors may be electrically coupled to the sensing pixel electrodes, and at least one of the plurality of the second thin-film transistors may be electrically coupled to the emitting devices.

The bottom surface of the thin-film transistor layer may include a plurality of concave portions, and the sensing pixel electrodes may be disposed in the concave portions.

Further, bottom surfaces of the sensing pixel electrodes may be located on the same plane as the bottom surface of the thin-film transistor layer except for parts in which the concave portions are disposed.

According to another aspect, embodiments of the present disclosure provide a display panel including a plurality of display pixels, and a plurality of sensing pixels disposed in at least a part of an area overlapping with the display pixels.

Each of the plurality of sensing pixels may include at least one first thin-film transistor, and a piezoelectric device disposed in a different layer from the first thin-film transistor and electrically coupled to the first thin-film transistor, and each of the plurality of display pixels may include at least one second thin-film transistor, and an emitting device disposed in a different layer from the second thin-film transistor and electrically coupled to the second thin-film transistor.

The first thin-film transistor and the second thin-film transistor may be disposed between the layer in which the piezoelectric device is disposed and the layer in which the emitting device is disposed.

According to another aspect, embodiments of the present disclosure provides a display device including a display panel, and a sensing driver circuit driving a sensing layer or sensing pixels included in the display panel.

According to embodiments of the present disclosure, a display panel and a display device which provide an ultrasonic sensing function may be provided by disposing a display layer including emitting devices on a thin-film transistor layer and disposing a sensing layer including piezoelectric devices under the thin-film transistor layer.

According to embodiments of the present disclosure, because a process of fabricating a sensing layer is performed after a process of fabricating a thin-film transistor layer and a display layer, a high-temperature process and a low-temperature process are separated from each other. Accordingly, a method of fabricating a display panel having an ultrasonic sensing function, while increasing process convenience is provided.

BRIEF DESCRIPTION OF THE DRAWINGS

The above and other objects, features, and advantages of the present disclosure will be more clearly understood from the following detailed description, taken in conjunction with the accompanying drawings, in which:

FIGS. 2, 3 and 4 are diagrams illustrating exemplary circuit structures and timing diagrams of a display pixel and a sensing pixel in a display panel according to embodiments of the present disclosure;

FIGS. 6 and 7 are diagrams illustrating other exemplary cross-section structures of the display panel including the sensing layer according to embodiments of the present disclosure.

DETAILED DESCRIPTION

Figure 1:
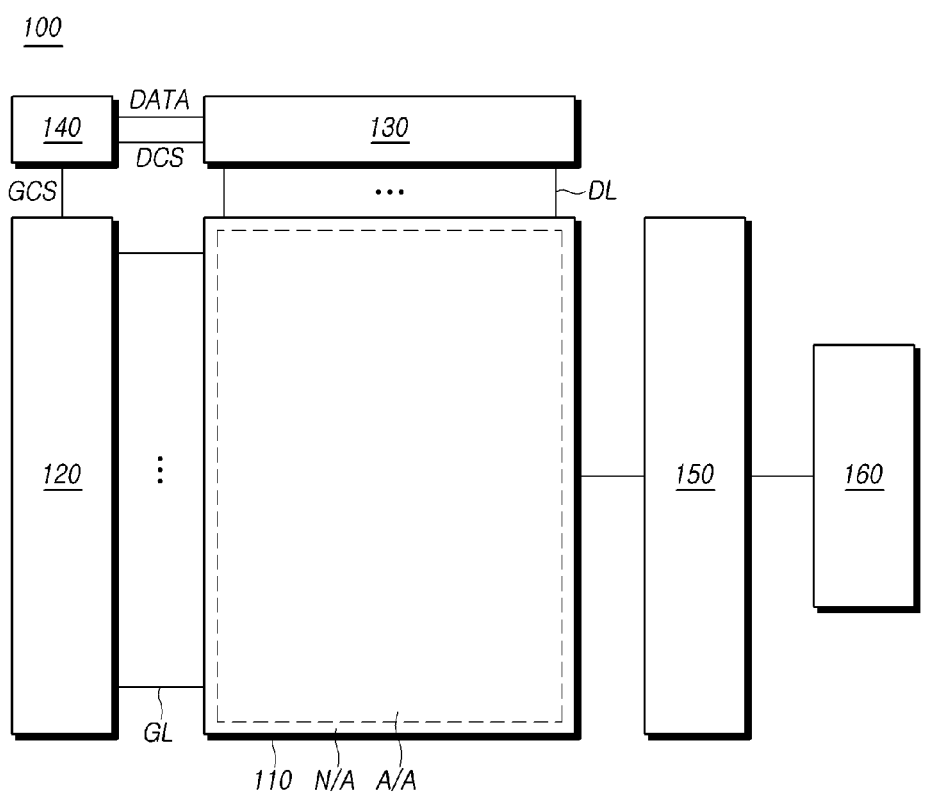
FIG. 1 is a schematic diagram illustrating the configuration of a display device according to embodiments of the present disclosure.

In the following description of examples or embodiments of the present invention, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present invention, detailed descriptions of well-known functions and components incorporated herein will be omitted when it is determined that the description may make the subject matter in some embodiments of the present invention rather unclear. The terms such as "including", "having", "containing", "constituting", "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present invention. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after", "subsequent to", "next", "before", and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

FIG. 1 is a schematic diagram illustrating the configuration of a display device 100 according to embodiments of the present disclosure.

Referring to FIG. 1, the display device 100 according to embodiments of the present disclosure may include a display panel 110 including an active area A/A and a non-active area N/A defined outside of the active area A/A. Pixels for image display (hereinafter, referred to as "display pixels DPXL") and pixels for sensing (hereinafter, referred to as "sensing pixels SPXL") may be disposed in the active area A/A of the display panel 110.

The display device 100 may include a gate driver circuit 120, a data driver circuit 130, a controller 140, and so on, to drive the display pixels DPXL. The display device 100 may further include a sensing driver circuit 150, a sensing controller 160, and so on, to drive the sensing pixels SPXL.

The gate driver circuit 120 is controlled by the controller 140, and controls driving timings of the display pixels DPXL by sequentially outputting a scan signal to a plurality of gate lines GL disposed in the display panel 110.

The gate driver circuit 120 may include one or more gate driver integrated circuits (GDICs), and may be located on only one side or both sides of the display panel 110 depending on a driving scheme.

Each GDIC may be coupled to a bonding pad of the display panel 110 by tape automated bonding (TAB) or chip on glass (COG) or may be configured as a gate in panel (GIP) type and disposed directly in the display panel 110. When needed, each GDIC may be integrated in the display panel 110. Further, each GDIC may be mounted on a film coupled to the display panel 110 by chip on film (COF).

The data driver circuit 130 receives image data from the controller 140, and converts the image data to an analog data voltage. In addition, the data driver circuit 130 outputs the data voltage to each data line DL at timings when a scan signal is applied through the gate lines GL, so that the display pixels DPXL may represent luminous intensities corresponding to the image data.

The data driver circuit 130 may include one or more source driver integrated circuits (SDICs).

Each SDIC may include a shift register, a latch circuit, a digital-to-analog converter, an output buffer, and so on.

Each SDIC may be coupled to the bonding pad of the display panel 110 by TAB or COG or may be disposed directly in the display panel 110. When needed, each SDIC may be integrated in the display panel 110. Further, each SDIC may be implemented by COF. In this case, the SDIC may be mounted on a film coupled to the display panel 110 and electrically coupled to the display panel 110 through a wire on the film.

The controller 140 applies various control signals to the gate driver circuit 120 and the data driver circuit 130 to control operations of the gate driver circuit 120 and the data driver circuit 130.

The controller 140 may be mounted on a printed circuit board (PCB), a flexible PCB (FPCB), or the like and electrically coupled to the gate driver circuit 120 and the data driver circuit 130 through the PCB, the FPCB, or the like.

The controller 140 controls the gate driver circuit 120 to output the scan signal at a timing defined by each frame. The controller 140 converts image data received from an external source into a data signal format used in the data driver circuit 130 and outputs the converted image data to the data driver circuit 130.

The controller 140 receives various timing signals, in addition to the image data, from an external source (e.g., a host system). The timing signals may include a vertical synchronization signal VSYNC, a horizontal synchronization signal HSYNC, an input data enable signal DE, a clock signal CLK, and so on.

The controller 140 may generate various control signals using the various timing signals received from the external source and output the control signals to the gate driver circuit 120 and the data driver circuit 130.

For example, the controller 140 outputs various gate control signals GCS, including a gate start pulse GSP, a gate shift clock signal GSC, a gate output enable signal GOE, and so on, to control the gate driver circuit 120.

The gate start pulse GSP controls operation start timings of the one or more GDICs of the gate driver circuit 120. The gate shift clock signal GSC is a clock signal input commonly to the one or more GDICs to control shift timings of the scan signal. The gate output enable signal GOE specifies timing information for the one or more GDICs.

Further, the controller 140 outputs various data control signals DCS, including a source start pulse SSP, a source sampling clock signal SSC, a source output enable signal SOE, and the like, to control the data driver circuit 130.

The source start pulse SSP controls data sampling start timings of the one or more SDICs of the data driver circuit 130. The source sampling clock signal SSC is a clock signal controlling a data sampling timing for each of the SDICs. The source output enable signal SOE controls an output timing of the data driver circuit 130.

The display device 100 may further include a power management integrated circuit (PMIC) which applies various types of voltage or current to the display panel 110, the gate driver circuit 120, the data driver circuit 130, and so on, or controls various types of voltage or current to be applied thereto.

The display pixels DPXL disposed in the active area A/A may be areas defined by intersections between the gate lines GL and the data lines DL. Depending on the type of the display device 100, a liquid crystal or an emitting device ED may be disposed at each display pixel DPXL.

The sensing pixels SPXL may also be disposed in the active area A/A, and a piezoelectric device PD and one or more thin-film transistors may be disposed in each sensing pixel SPXL.

The sensing driver circuit 150 and the sensing controller 160 may drive the piezoelectric devices PD disposed in the sensing pixels SPXL to generate and use ultrasonic waves in the sensing pixels SPXL.

For example, the sensing driver circuit 150 may apply a driving signal to the piezoelectric devices PD disposed in the sensing pixels SPXL and detect sensing signals in the sensing pixels SPXL. Alternatively, the sensing controller 160 may apply the driving signal directly to the sensing pixels SPXL, and the sensing driver circuit 150 may detect the sensing signals.

The sensing pixels SPXL may be disposed in an area separate from that of the display pixels DPXL or in an area overlapping with that of the display pixels DPXL.

Figure 2:
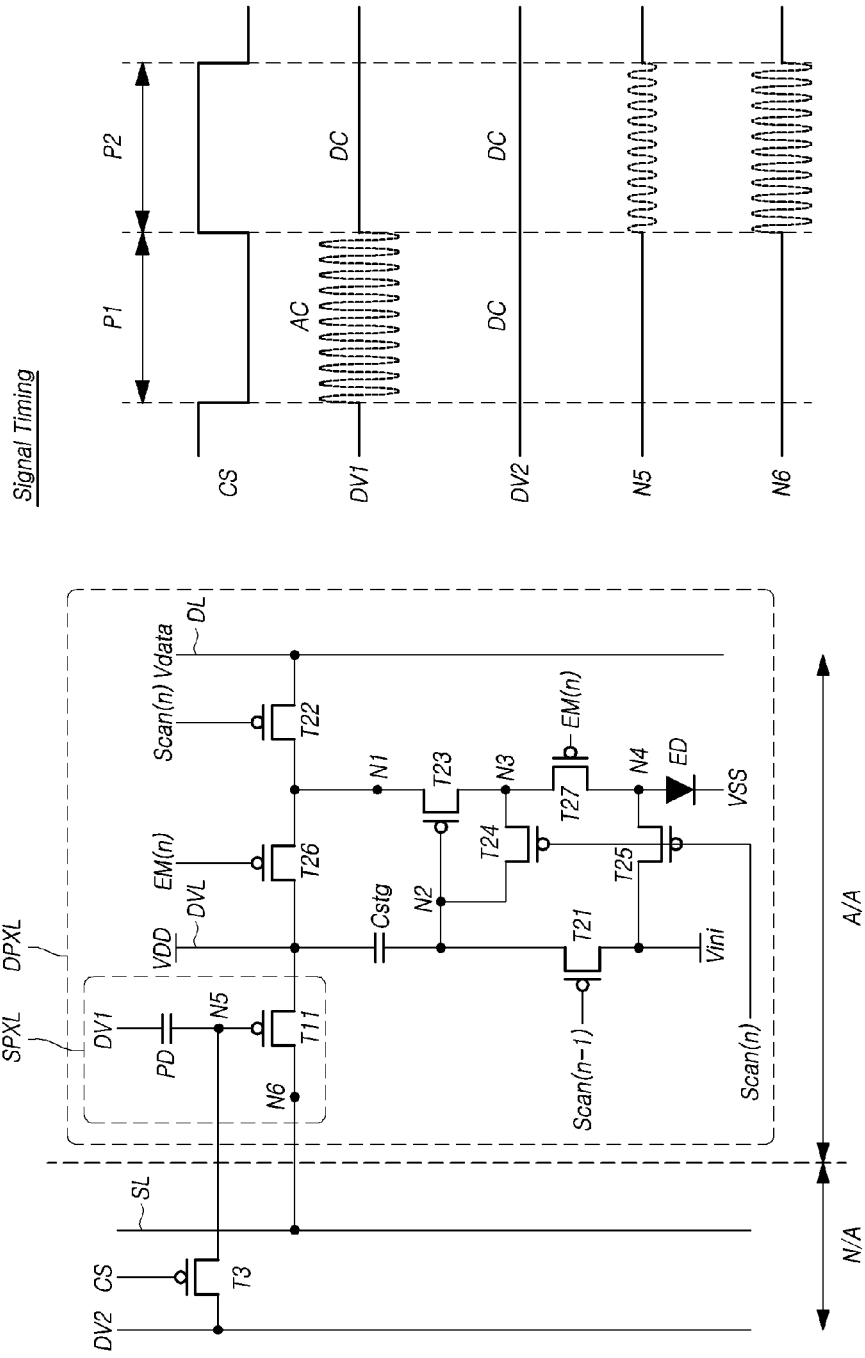
Figure 3:
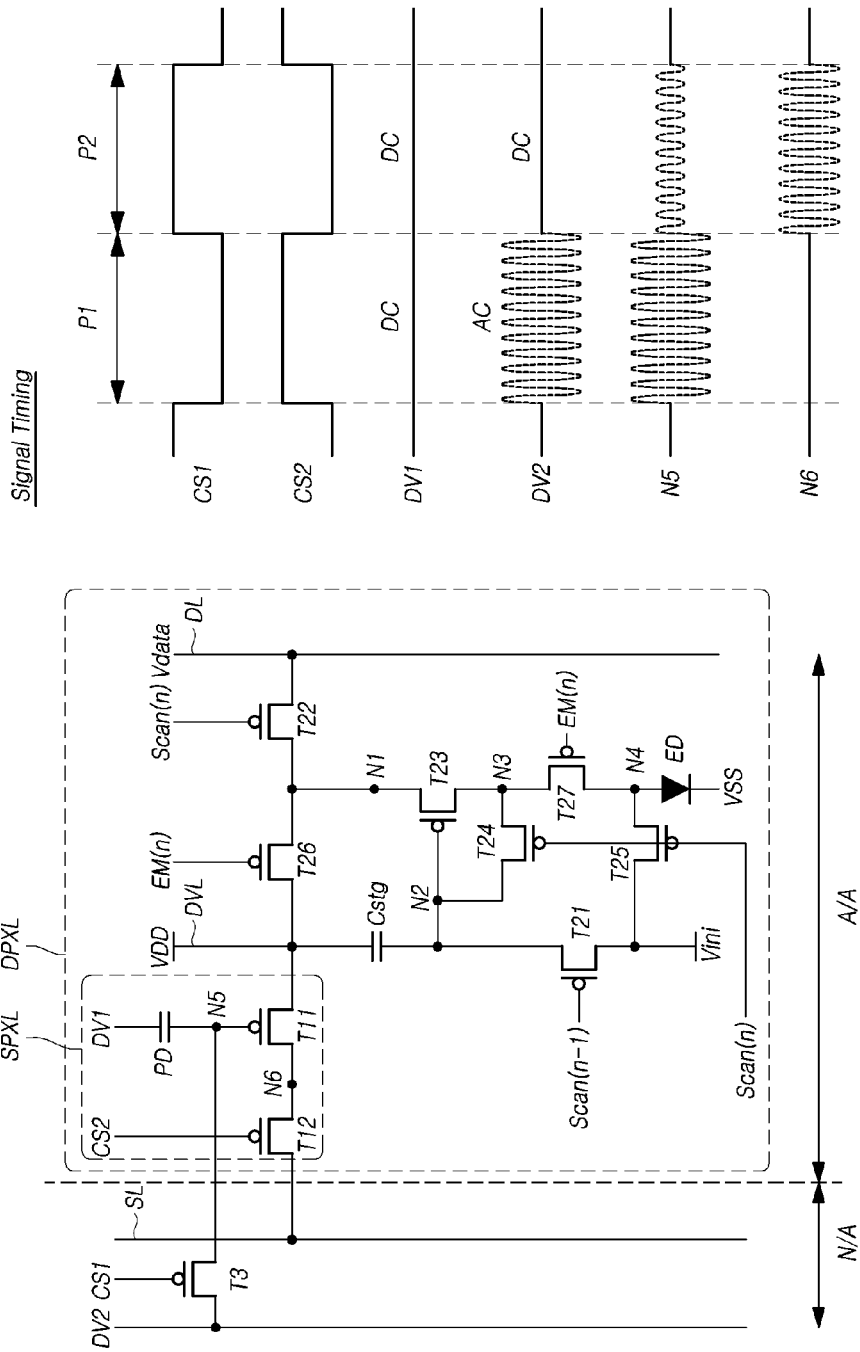

FIGS. 2, 3 and 4 are diagrams illustrating exemplary circuit structures of a display pixel DPXL and a sensing pixel SPXL in the display panel 110 according to embodiments of the present disclosure.

Referring to FIG. 2, the display pixel DPXL disposed in the display panel 110 may include an emitting device ED, one or more thin-film transistors driving the emitting device ED, and a storage capacitor Cstg. Although the display pixel DPXL is shown as a 7T1C structure in the example of FIG. 2, the display pixel DPXL is not limited thereto.

The sensing pixel SPXL disposed in the display panel 110 may include a piezoelectric device PD and one or more thin-film transistors for sensing by means of the piezoelectric device PD.

In the present disclosure, a thin-film transistor for sensing by means of the piezoelectric device PD is referred to as a "first thin-film transistor", and a thin-film transistor for driving the emitting device ED is referred to as a "second thin-film transistor".

The display pixel DPXL and the sensing pixel SPXL may be disposed in separate areas or may be disposed at least partially overlapping with each other.

The display pixel DPXL may be driven at the timing of the scan signal applied through a gate line GL.

For example, when the scan signal is applied to an $(n-1)^{th}$ gate line GL, a transistor T21 is turned on, and an initialization voltage Vini is applied to a second node N2. Therefore, the gate node of a transistor T23 may be initialized.

When the scan signal is applied to an $n^{th}$ gate line GL, transistors T22, T24 and T25 are turned on. As the transistor T22 is turned on, a data voltage Vdata applied through a data line DL is applied to a first node N1.

Because the transistor 124 electrically coupled between the second node N2 and a third node N3 is in the turn-on state, the data voltage Vdata applied to the first node N1 is applied to the second node N2 through the transistor T23. Herein, the data voltage Vdata may reflect the threshold voltage Vth of the transistor T23 and then be applied to the second node N2. Therefore, the threshold voltage Vth of the transistor T23 serving as a driving transistor may be compensated.

Because the transistor T25 is in the turn-on state, the initialization voltage Vini may be applied to a fourth node N4. Therefore, the voltage of an anode electrode of the emitting device ED may be initialized.

When the data voltage Vdata which has reflected the threshold voltage Vth of the transistor T23 is applied to the second node N2 being the gate node of the transistor T23, a signal EM may be applied to turn on transistors T26 and T27. Therefore, current corresponding to the data voltage Vdata may be supplied to the emitting device ED, so that the emitting device ED may represent a luminous intensity corresponding to image data.

The sensing pixel SPXL may include the piezoelectric device PD and perform ultrasonic generation and ultrasonic sensing by a voltage applied to the piezoelectric device PD. A transistor T11 disposed in the sensing pixel SPXL may be electrically coupled between a driving voltage line DVL to which a display driving voltage VDD is supplied and a sensing line SL.

The sensing pixel SPXL may be driven in a period separate from a driving period of the display pixel DPXL. Alternatively, the sensing pixel SPXL may be driven simultaneously with the display pixel DPXL in the same period.

The sensing pixel SPXL may be driven separately in an ultrasonic generation period and an ultrasonic sensing period.

For example, a first sensing driving voltage DV1 being an alternating current (AC) voltage may be applied to the piezoelectric device PD in a first period P1. The first sensing driving voltage DV1 may be a voltage that swings between −100V and +100V in one embodiment.

As a transistor T3 is turned on by a sensing control signal CS, a second sensing driving voltage DV2 being a direct current (DC) voltage may be applied to a fifth node N5. The second sensing driving voltage DV2 may be a voltage at a level that turns off the transistor T11.

The transistor T3 and the sensing line SL may be disposed in the non-active area N/A of the display panel 110. The first sensing driving voltage DV1 and the second sensing driving voltage DV2 may be supplied and controlled by the sensing driver circuit 150 or the sensing controller 160.

As the first sensing driving voltage DV1 being an AC voltage and the second sensing driving voltage DV2 being a DC voltage are applied to both electrodes of the piezoelectric device PD, the piezoelectric device PD may vibrate, thus generating ultrasonic waves.

In a second period P2, the first sensing driving voltage DV1 being a DC voltage may be applied to the piezoelectric device PD. As the transistor T3 is turned off by the sensing control signal CS, the fifth node N5 may be placed in a floating state.

When reflected ultrasonic waves change the polarized state of a piezoelectric material contained in the piezoelectric device PD, an electrical signal output from the piezoelectric device PD may change the voltage level of the fifth node N5.

The change in the voltage level of the fifth node N5 may lead to repetition of turn-on and turn-off of the transistor T11, and the display driving voltage VDD may be transferred to a sixth node N6 through the transistor T11.

That is, the electrical signal output from the piezoelectric device PD which has received the ultrasonic waves may be amplified by the transistor T11 and detected through the sensing line SL, thereby enabling ultrasonic sensing.

Alternatively, an additional thin-film transistor may be disposed in the sensing pixel SPXL and a different voltage may be applied to the piezoelectric device PD, thereby enabling ultrasonic generation and ultrasonic sensing.

Referring to FIG. 3, the sensing pixel SPXL may include the transistor T11 electrically coupled to the piezoelectric device PD, and a transistor T12 electrically coupled between the sixth node N6 and the sensing line SL. The transistor T12 may be controlled by a second sensing control signal CS2. The second sensing control signal CS2 may have an opposite level to the level of a first sensing control signal CS1 that controls the transistor T3.

In the first period P1, the transistor T3 may be turned on by the first sensing control signal CS1, and the second sensing driving voltage DV2 being an AC voltage may be applied to the fifth node N5. Further, the first sensing driving voltage DV1 being a DC voltage may be applied to the piezoelectric device PD.

Herein, the transistor T12 may be in a turn-off state by the second sensing control signal CS2. Therefore, the piezoelectric device PD may be driven by the first sensing driving voltage DV1 and the second sensing driving voltage DV2 applied to the piezoelectric device PD, thereby generating ultrasonic waves.

In the second period P2, the transistor T3 may be turned off by the first sensing control signal CS1, and the transistor T12 may be turned off by the second sensing control signal CS2.

Therefore, the fifth node N5 may be placed in the floating state, and when the piezoelectric device PD receives reflected ultrasonic waves, the voltage level of the fifth node N5 may be changed by an electrical signal output from the piezoelectric device PD.

Due to the change in the voltage level of the fifth node N5, the display driving voltage VDD may be transferred to the sixth node N6 through the transistor T11. Because the transistor T12 is in the turn-on state in the second period P2, the voltage transferred to the sixth node N6 may be detected through the sensing line SL, so that sensing may be performed.

As such, the piezoelectric device PD may be driven in various manners according to the arrangement structure of thin-film transistors in the sensing pixel SPXL.

Further, in the example of FIG. 3, different types of thin-film transistors may be disposed in the sensing pixel SPXL to control the transistors T12 and T3 by a single sensing control signal CS.

Referring to FIG. 4, the transistor T12 may be of an N type and the transistor T3 may be of a P type in the sensing pixel SPXL. The transistors T12 and T3 may be controlled by the same sensing control signal CS.

In the first period P1, as the sensing control signal CS is applied at a level that turns on the transistor T3, the transistor T3 may be turned on, and the transistor T12 may be turned off. Further, as the first sensing driving voltage DV1 being a DC voltage is applied to the piezoelectric device PD and the second sensing driving voltage DV2 being an AC voltage is applied to the fifth node N5, the piezoelectric device PD may generate ultrasonic waves.

In the second period P2, the sensing control signal CS may be applied at a level that turns off the transistor T3, thus turning off the transistor T3 and turning on the transistor T12. Therefore, when the voltage level of the fifth node N5 in the floating state is changed by a signal output from the piezoelectric device PD according to ultrasonic wave reception, a voltage output to the sixth node N6 may be detected through the sensing line SL, so that sensing may be performed.

As such, as sensing pixels SPXL each including a piezoelectric device PD are disposed in the active area A/A, the display panel 110 capable of ultrasonic sensing, while displaying an image in the active area A/A is provided according to embodiments of the present disclosure.

The piezoelectric devices PD may be disposed opposite to a layer in which the emitting devices ED are disposed, with respect to a layer in which thin-film transistors for display driving and sensing are disposed.

Figure 5:
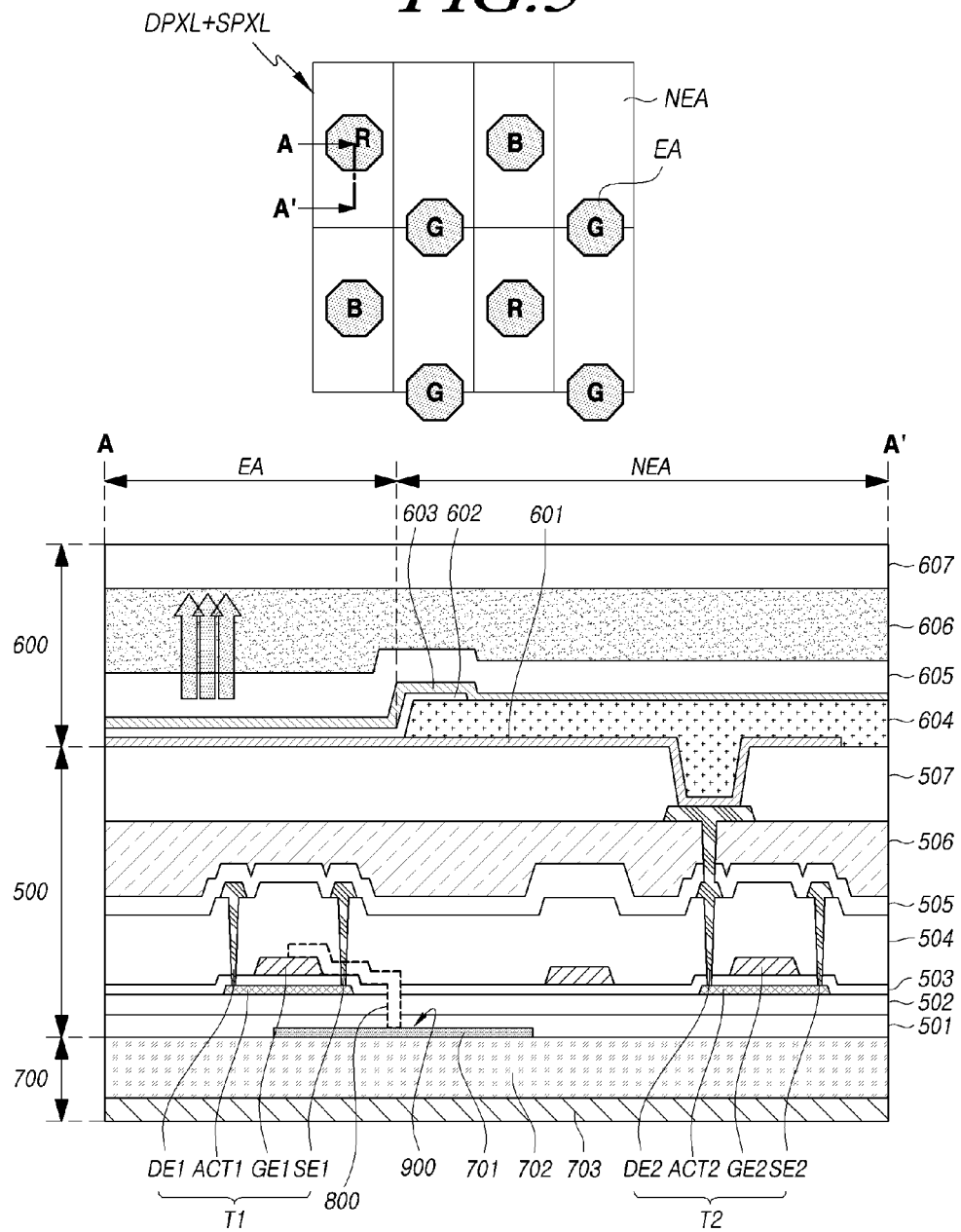
FIG. 5 is a diagram illustrating an exemplary plan view and cross-section structure of a display panel including a sensing layer according to embodiments of the present disclosure.

FIG. 5 is a diagram illustrating an exemplary cross-section structure of the display panel 110 alone A-A' including a sensing layer 700 according to embodiments of the present disclosure.

Referring to FIG. 5, a pixel disposed in the active area A/A of the display panel 110 may include a display pixel DPXL and a sensing pixel SPXL. As described before, the display pixel DPXL and the sensing pixel SPXL may be disposed in separate areas or may overlap partially with each other. Further, sensing pixels SPXL may be disposed in a one-to-one correspondence with display pixels DPXL, or two or more display pixels DPXL may be disposed to correspond to one sensing pixel SPXL. In a structure in which display pixels DPXL one to one correspond to sensing pixels SPXL, one pixel may include an emitting area EA and a non-emitting area NEA. The sensing pixel SPXL may be disposed in a part of the emitting area EA and the non-emitting area NEA or overlapping with a part of the emitting area EA and the non-emitting area NEA. Referring to the cross-section of the pixel taken along line A-A' in FIG. 5, the display panel 110 may include a thin-film transistor layer 500 including a plurality of first thin-film transistors T1 and a plurality of second thin-film transistors T2, a display layer 600 disposed on the thin-film transistor layer 500 and including a plurality of emitting devices ED, and the sensing layer 700 disposed under the thin-film transistor layer 500 and including a plurality of piezoelectric devices PD.

The thin-film transistor layer 500 may include a polyimide layer 501 and a buffer layer 502 disposed on the polyimide layer 501. Active layers ACT1 and ACT2 may be disposed on the buffer layer 502, and a gate insulation layer 503 and gate electrodes GE1 and GE2 may be disposed on the active layers ACT1 and ACT2.

An inter-layer insulation layer 504 may be disposed on the gate electrodes GE1 and GE2, and source electrodes SE1 and SE2 and drain electrodes DE1 and DE2 may be coupled to the active layers ACT1 and ACT2 through holes formed in the inter-layer insulation layer 504. The inter-layer insulation layer 504 may be a single insulation layer or include a plurality of insulation layers, when needed.

A protection layer 505 may be disposed on the inter-layer insulation layer 504, and planarization layers 506 and 507 may be disposed on the protection layer 505.

The display layer 600 may be disposed on the planarization layers 506 and 507.

The display layer 600 may include a first electrode 601, a light emitting layer 602, and a second electrode 603. The first electrode 601 may be coupled to the second drain electrode DE2 or the second source electrode SE2 of a second thin-film transistor T2 through holes formed in the planarization layers 506 and 507.

In the display layer 600, a bank 604 may be disposed in the non-emitting area NEA other than the emitting area EA, and encapsulation layers 605, 606 and 607 may be disposed on the second electrode 603 to protect the emitting devices ED.

The sensing layer 700 may be disposed under the thin-film transistor layer 500.

The sensing layer 700 may include a sensing pixel electrode 701, a piezoelectric material 702 disposed under the sensing pixel electrode 701, and a sensing common electrode 703 disposed under the piezoelectric material 702. A reflection layer may further be disposed under the sensing common electrode 703 to reflect ultrasonic waves directed toward the opposite to a surface on which an image is displayed to the sensing layer 700.

The sensing pixel electrode 701 may correspond to the fifth node N5 in the examples illustrated in FIGS. 2, 3 and 4. The sensing common electrode 703 may be an electrode to which the first sensing driving voltage DV1 is applied in the examples illustrated in FIGS. 2, 3 and 4.

That is, the sensing pixel electrode 701, the piezoelectric material 702, and the sensing common electrode 703 included in the sensing layer 700 may form a piezoelectric device PD.

The sensing pixel electrode 701 may be disposed under the thin-film transistor layer 500, covered by the polyimide layer 501.

For example, a concave portion 900 may be formed into the bottom surface of the polyimide layer 501, and the sensing pixel electrode 701 may be disposed in the concave portion 900 of the polyimide layer 501. The concave portion 900 may be a structure formed in the process of depositing the sensing pixel electrode 701 and depositing the polyimide layer 501 on the sensing pixel electrode 701 in a fabrication process.

Further, the bottom surface of the sensing pixel electrode 701 and the bottom surface of the polyimide layer 501 may be on the same plane. That is, the bottom surface of the polyimide layer 501 except for the concave portion 900 may be on the same plane with the bottom surface of the sensing pixel electrode 701.

As the sensing pixel electrode 701 is sunken into the bottom surface of the polyimide layer 501, the piezoelectric material 702 may be disposed in a uniform thickness under the sensing pixel electrode 701, and the sensing common electrode 703 may be easily disposed.

The sensing pixel electrode 701 may be electrically coupled to the first gate electrode GE1 of a first thin-film transistor T1 disposed in the thin-film transistor layer 500.

For example, the sensing pixel electrode 701 may be electrically coupled to the first gate electrode GE1 by a connection electrode 800 disposed in holes formed in the gate insulation layer 503, the buffer layer 502, and the polyimide layer 501 disposed under the first gate electrode GE1. That is, the connection electrode 800 may have one end coupled to the sensing pixel electrode 701 and the other end coupled to the first gate electrode GE1 of the first thin-film transistor T1. The connection electrode 800 may be disposed separately from the first source electrode SE1 or the first drain electrode DE1 of the first thin-film transistor T1. The connection electrode 800 may be formed of the same material as the first gate electrode GE1.

Alternatively, the sensing pixel electrode 701 may be electrically coupled to the first gate electrode GE1 by the connection electrode 800 disposed in holes formed in all insulation layers disposed under the first gate electrode GE1 and a partial insulation layer disposed on the first gate electrode GE1. That is, a hole may be formed in the inter-layer insulation layer 504 as well as the gate insulation layer 503, the buffer layer 502, and the polyimide layer 501. Further, the sensing pixel electrode 701 may be electrically coupled to the first gate electrode GE1 by the connection electrode 800 formed of the same material as the first source electrode SE1 and the first drain electrode DE1.

Further, when the first gate electrode GE1 is disposed under the first active layer ACT1, the sensing pixel electrode 701 may be coupled to the first gate electrode GE1 through the holes formed in the buffer layer and the polyimide layer 501 which are disposed under the first gate electrode GE1, when needed.

The first thin-film transistor T1 may be electrically coupled between the driving voltage line DVL through which the display driving voltage VDD is applied and the sensing line SL used to detect a sensing signal.

Accordingly, as the first gate electrode GE1 is coupled to the sensing pixel electrode 701, the first thin-film transistor may be turned on and off by a signal output from the piezoelectric device PD receiving ultrasonic waves, and the sensing signal may be detected through the sensing line SL.

As such, the sensing layer 700 is disposed under the thin-film transistor layer 500 and the sensing signal is detected using the first thin-film transistors T1 included in the thin-film transistor layer 500 in embodiments of the present disclosure. Therefore, ultrasonic sensing may be performed in the active area A/A of the display panel 110.

Further, as the first thin-film transistors T1 for ultrasonic sensing and the second thin-film transistors T2 for display driving are disposed in the same layer, the sensing pixels SPXL that perform ultrasonic sensing may easily be implemented, without adding the process of disposing the first thin-film transistors T1.

Alternatively, the first thin-film transistors T1 for ultrasonic sensing and the second thin-film transistors T2 for display driving may be disposed in different layer, when needed.

Figure 6:
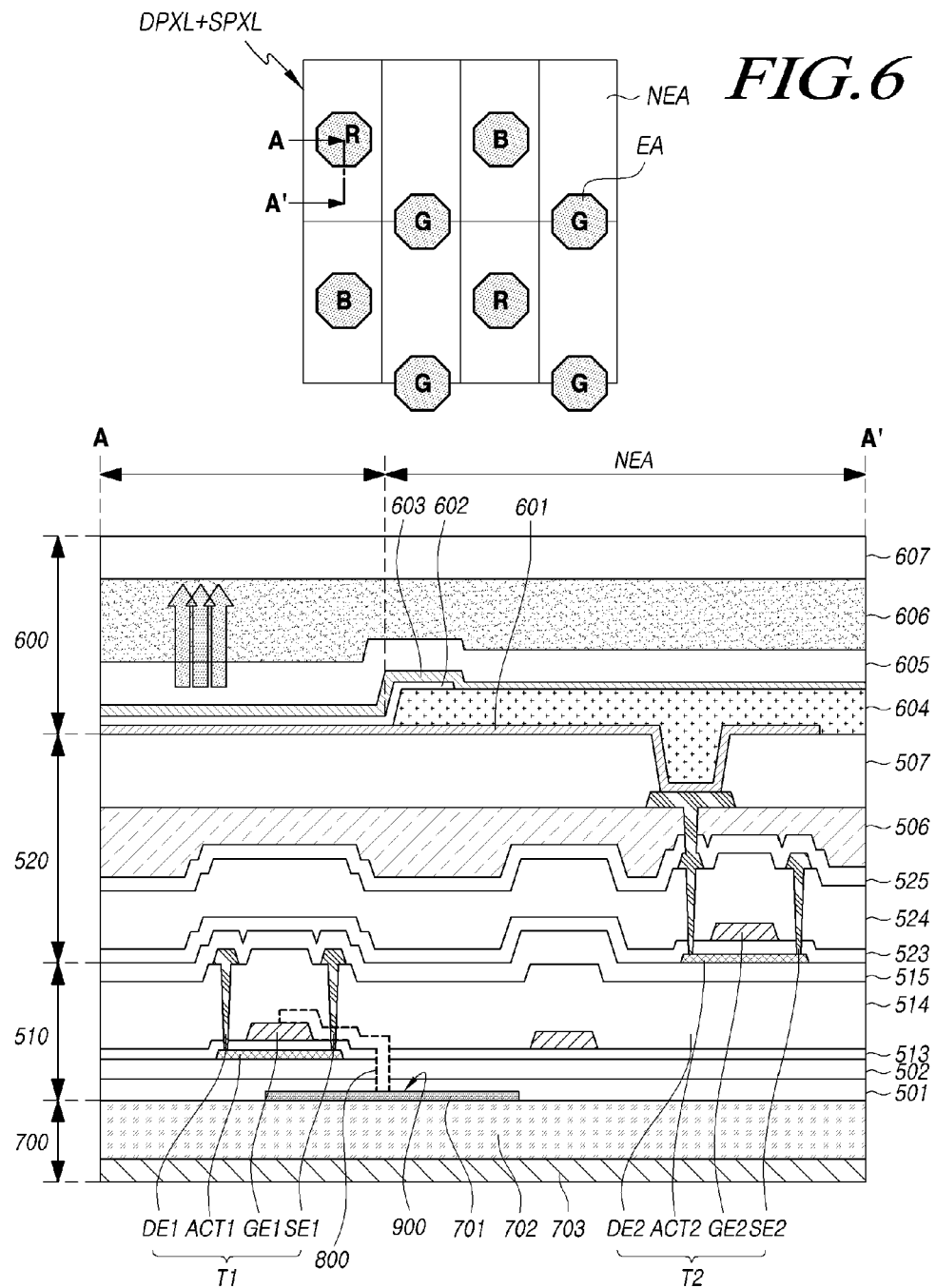

FIGS. 6 and 7 are diagrams illustrating other examples of the cross-section structure of the display panel 110 including the sensing layer 700 according to embodiments of the present disclosure.

Referring to the cross-section of a pixel taken along line A-A' in FIG. 6, the display panel 110 according to embodiments of the present disclosure may include a first thin-film transistor layer 510 in which a plurality of first thin-film transistors T1 are disposed, and a second thin-film transistor layer 520 in which a plurality of second thin-film transistors T2 are disposed.

The second thin-film transistor layer 520 may be disposed on the first thin-film transistor layer 510.

Specifically, the first thin-film transistor layer 510 may include the polyimide layer 501 and the buffer layer 502. The first active layer ACT1, a first gate insulation layer 513, the first gate electrode GE1, and a first inter-layer insulation layer 514 may be disposed on the buffer layer 502.

The first source electrode SE1 and the first drain electrode DE1 may be coupled to the first active layer ACT1 through holes formed in the first inter-layer insulation layer 514, and a first protection layer 515 may be disposed on the first inter-layer insulation layer 514.

The second thin-film transistor layer 520 may be disposed on the first protection layer 515.

The second thin-film transistor layer 520 may be stacked sequentially with, for example, the second active layer ACT2, a second gate insulation layer 523, the second gate electrode GE2, a second inter-layer insulation layer 524, and a second protection layer 525.

The planarization layers 506 and 507 may be disposed on the second protection layer 525, and the display layer 600 including emitting devices ED may be disposed on the planarization layers 506 and 507.

The sensing layer 700 may be disposed under the first thin-film transistor layer 510.

The sensing layer 700 may include the sensing pixel electrode 701 disposed under the polyimide layer 501 and electrically coupled to the first gate electrode GE1, the piezoelectric material 702 disposed under the sensing pixel electrode 701, and the sensing common electrode 703 disposed under the piezoelectric material 702.

The sensing pixel electrode 701 may be disposed in the concave portion 900 of the polyimide layer 501.

The sensing pixel electrode 701 may be electrically coupled to the first gate electrode GE1 by the connection electrode 800 disposed in holes formed in the first gate insulation layer 513, the buffer layer 502, and the polyimide layer 501 disposed under the first gate electrode GE1. The connection electrode 800 may be formed of the same material as the first gate electrode GE1.

Alternatively, as in the example of FIG. 7, the sensing pixel electrode 701 may be electrically coupled to the first gate electrode GE1 by the connection electrode 800 disposed in a hole formed in the first inter-layer insulation layer 514 disposed on the first gate electrode GE1 and holes formed in the first gate insulation layer 513, the buffer layer 502, and the polyimide layer 501 disposed under the first gate electrode GE1. The connection electrode 800 may be formed of the same material as the first source electrode SE1 and the first drain electrode DE1.

Further, as described before, when the first gate electrode GE1 is disposed under the first active layer ACT1, the sensing pixel electrode 701 may be coupled to the first gate electrode GE1 by the connection electrode 800 disposed in the holes formed in the buffer layer 502 and the polyimide layer 501.

When needed, the reflection layer may be disposed under the sensing common electrode 703 to reflect ultrasonic waves directed downward from the sensing layer 700 back to the sensing layer 700.

As such, the first thin-film transistor T1 for sensing through the sensing layer 700 and the second thin-film transistor T2 for driving the emitting devices ED disposed in the display layer 600 may be disposed on different layers.

As the first thin-film transistors T1 for sensing are disposed in a different layer from the second thin-film transistors T2, the sensing pixels SPXL may be disposed without affecting the arrangement structure of the display pixels DPXL.

That is, in the case of a high-definition display panel 110, there may be lack of areas in which the first thin-film transistors T1 for sensing are disposed in the display pixels DPXL. Further, the display pixels DPXL and the sensing pixels SPXL may require different resolutions under circumstances.

In this case, the first thin-film transistors T1 and the second thin-film transistors T2 may be disposed in different layers in such a manner that the sensing pixels SPXL and the display pixels DPXL overlap with each other. Therefore, the sensing pixels SPXL may be disposed without affecting the arrangement structure of the display pixels DPXL.

Further, the sensing layer 700 including piezoelectric devices PD built in the display panel 110 may be disposed easily by disposing the first thin-film transistor layer 510 and the sensing layer 700, for ultrasonic sensing under the second thin-film transistor layer 520 for display driving.

FIGS. 8A to 8F are diagrams illustrating an exemplary process of fabricating the display panel 110 according to embodiments of the present disclosure.

Figure 8A:
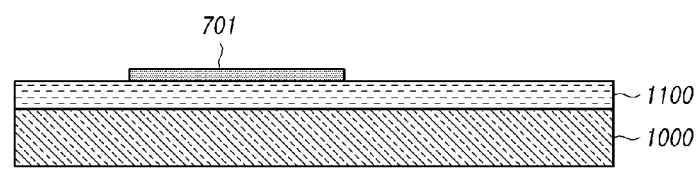
FIGS. 8A to 8F are diagrams illustrating an exemplary process of fabricating the display panel including the sensing layer according to embodiments of the present disclosure.

Referring to FIG. 8A, a sacrificial layer 1100 is disposed on a substrate 1000. Then, an electrode pattern is disposed on the sacrificial layer 1100 to implement the sensing pixel electrode 701 of the sensing layer 700.

Figure 8B:
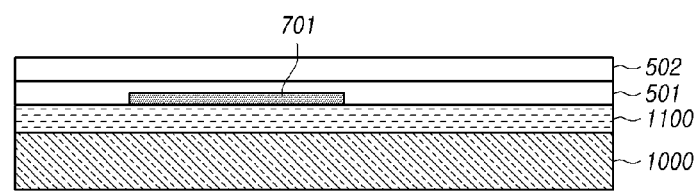

Referring to FIG. 8B, when the sensing pixel electrode 701 is disposed completely, the polyimide layer 501 and the buffer layer 502 are sequentially deposited on the sensing pixel electrode 701. Therefore, the sensing pixel electrode 701 may be covered by the polyimide layer 501. Further, the bottom surface of the sensing pixel electrode 701 and the bottom surface of the polyimide layer 501 may be located on the same plane.

Figure 8C:
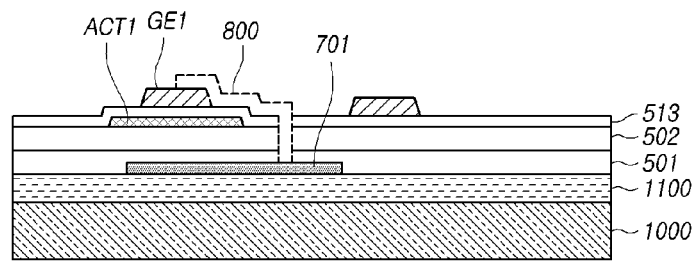

Referring to FIG. 8C, the first active layer ACT1 is disposed on the buffer layer 502, and the first gate insulation layer 513 is disposed on the first active layer ACT1. The first gate electrode GE1 is disposed on the first gate insulation layer 513.

Holes may be formed in the first gate insulation layer 513, the buffer layer 502, and the polyimide layer 501 to expose the sensing pixel electrode 701. Then, the connection electrode 800 may be disposed in the holes to electrically couple the sensing pixel electrode 701 to the first gate electrode GE1.

Alternatively, as in the above-described example, the sensing pixel electrode 701 may be electrically coupled to the first gate electrode GE1 by disposing the first inter-layer insulation layer 514 on the first gate electrode GE1, forming a hole in the first inter-layer insulation layer 514, and disposing the connection electrode 800 in the hole.

As such, sensing pixels SPXL may be implemented by adding only the process of disposing the sensing pixel electrode 701 and the connection electrode 800 to the process of depositing thin-film transistors on the substrate 1000.

Figure 8D:
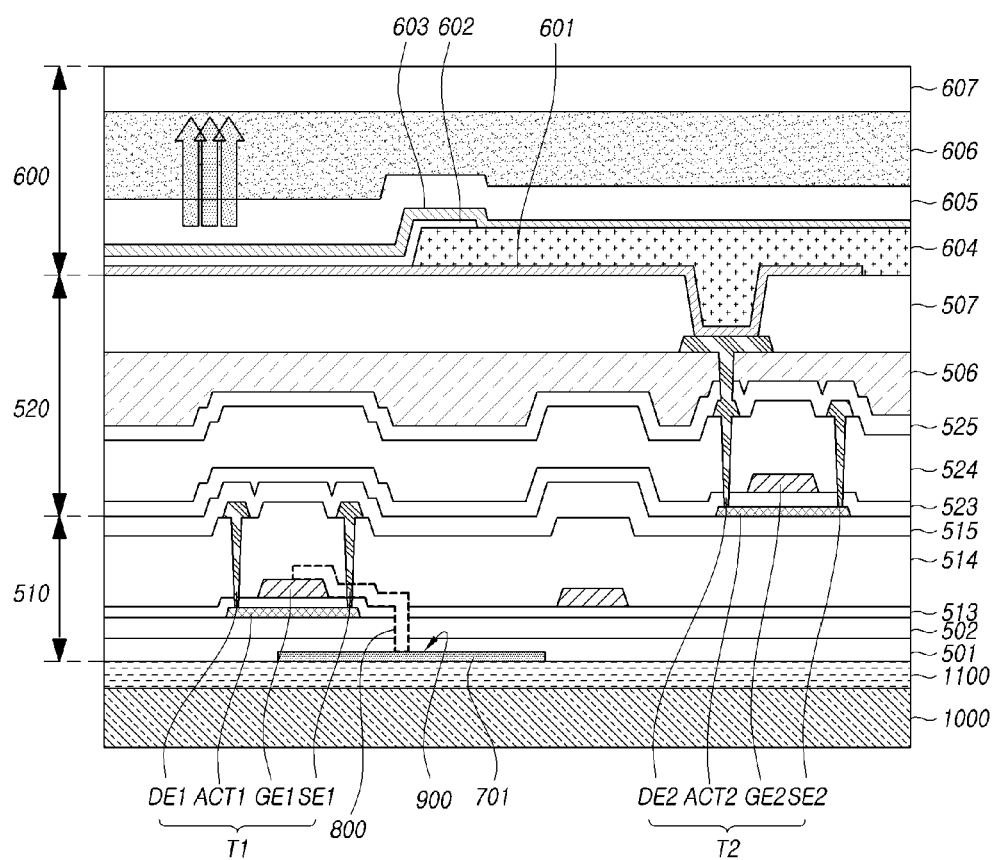

Referring to FIG. 8D, after the formation of the sensing pixel electrode 701 and the connection electrode 800 is completed, the second thin-film transistors T2 and the emitting devices ED may be disposed to display an image by sequentially depositing the second thin-film transistor layer 520 and the display layer 600.

The process of depositing the first thin-film transistor layer 510, the second thin-film transistor layer 520, and the display layer 600 may be performed at a high temperature.

Figure 8E:
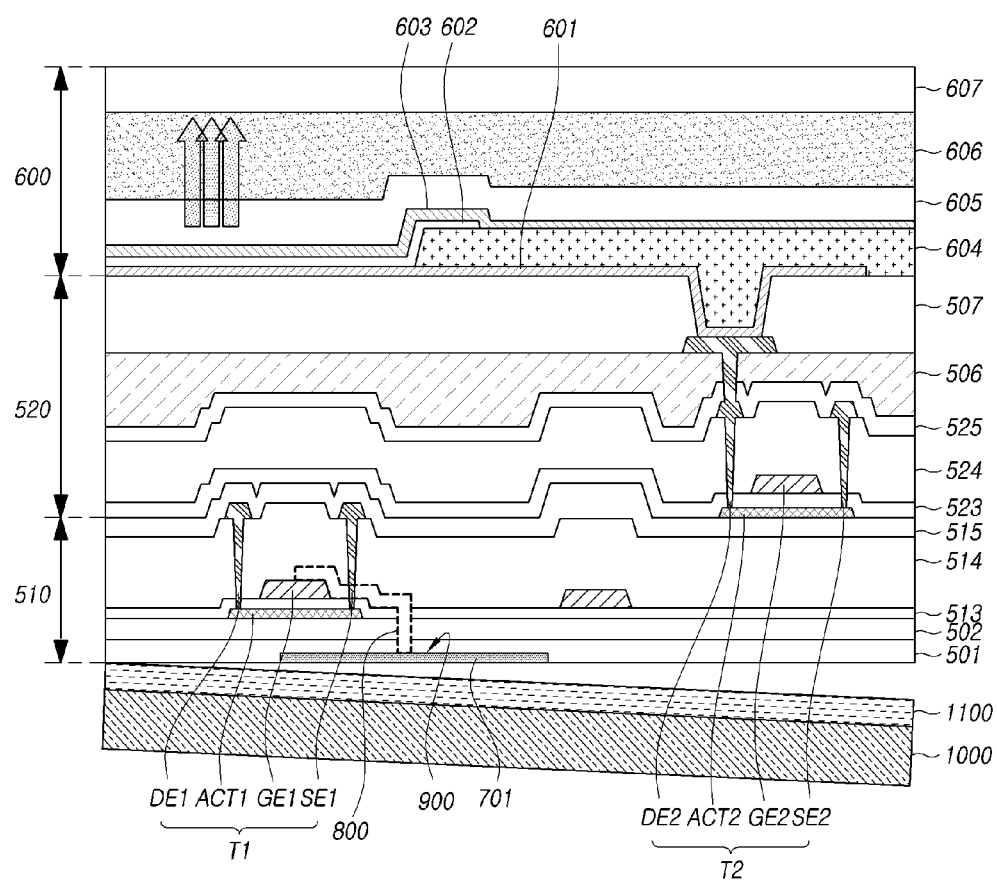

Referring to FIG. 8E, when the display layer 600 is completely deposited, the substrate 1000 and the sacrificial layer 1100 are removed from the first thin-film transistor layer 510 by laser lift off (LLO). That is, the substrate 1000 may be removed from the first thin-film transistor layer 510 by removing the sacrificial layer 1100.

Therefore, the sensing pixel electrode 701 disposed under the polyimide layer 501 is exposed outward.

Figure 8F:
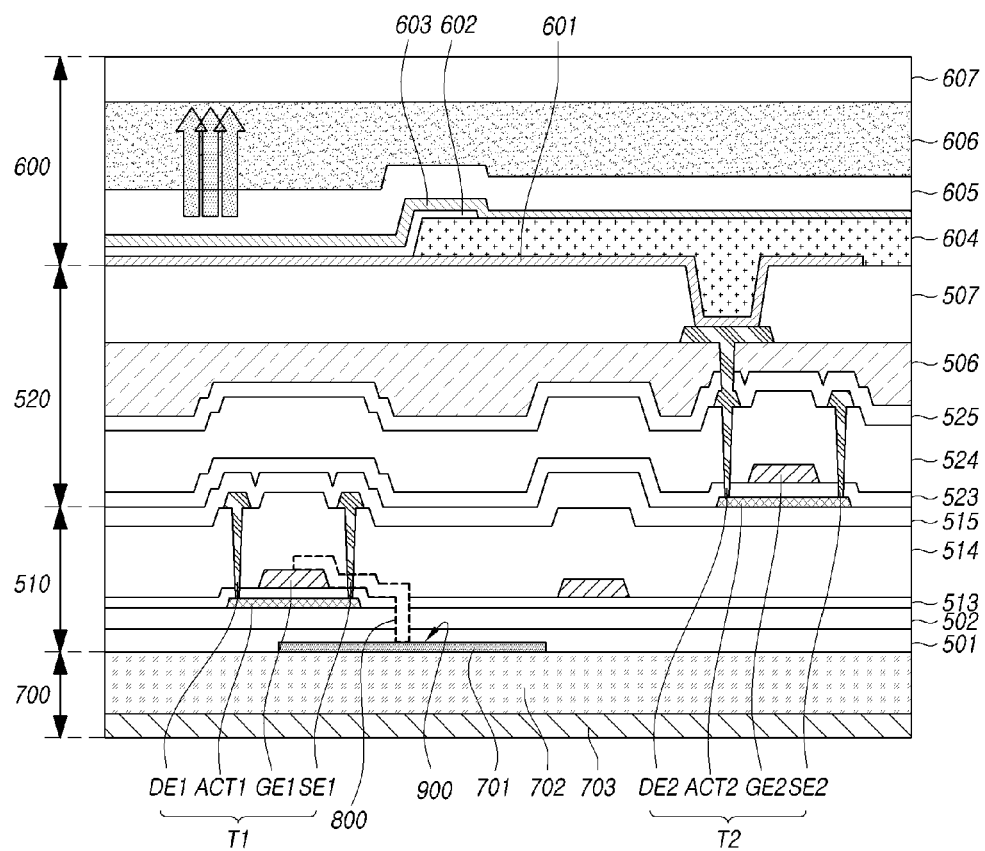

Referring to FIG. 8F, the piezoelectric material 702 may be deposited on the bottom surface of the polyimide layer 501, and the sensing common electrode 703 may be deposited under the piezoelectric material 702.

The process of depositing the piezoelectric material 702 may be performed at a low temperature.

As the piezoelectric material 702 and the sensing common electrode 703 are disposed under the first thin-film transistor layer 510 in this manner, the sensing layer 700 may be implemented easily after the process of depositing the display layer 600.

Further, process convenience may be offered and the display panel 110 with the sensing pixels SPXL implemented therein may be provided, by depositing the sensing layer in a low-temperature process after the high-temperature process of depositing the first thin-film transistor layer 510, the second thin-film transistor layer 520, and the display layer 600.

According to the foregoing embodiments of the present disclosure, the display panel 110 with piezoelectric devices PD built therein may easily be implemented by disposing the sensing layer 700 under the thin-film transistor layer 500 after the process of forming the thin-film transistor layer 500 and the display layer 600.

Herein, the sensing layer 700 may easily be implemented by pre-disposing an electrode pattern for forming the sensing pixel electrode 701 of the sensing layer 700 before the thin-film transistor layer 500 is deposited, and then depositing the thin-film transistor layer 500.

Further, the sensing pixels SPXL may be implemented without adding the process of disposing thin-film transistors included in the sensing pixels SPXL by coupling some thin-film transistors included in the thin-film transistor layer 500 to the sensing layer 700 and detecting a sensing signal.

Alternatively, the first thin-film transistors T1 for sensing and the second thin-film transistors T2 for display driving are disposed in different layers, and the display layer 600 and the sensing layer 700 are implemented, when needed. Therefore, the display panel 110 capable of ultrasonic sensing in the active area A/A without affecting a display resolution and implementation of the display pixels DPXL may be provided.

The above description has been presented to enable any person skilled in the art to make and use the technical idea of the present invention, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present invention. The above description and the accompanying drawings provide an example of the technical idea of the present invention for illustrative purposes only. That is, the disclosed embodiments are intended to illustrate the scope of the technical idea of the present invention. Thus, the scope of the present invention is not limited to the embodiments shown, but is to be accorded the widest scope consistent with the claims. The scope of protection of the present invention should be construed based on the following claims, and all technical ideas within the scope of equivalents thereof should be construed as being included within the scope of the present invention.

What is claimed is:

1. A display panel comprising:
   a thin-film transistor layer in which a plurality of first thin-film transistors and a plurality of second thin-film transistors are disposed;
   a display layer disposed on the thin-film transistor layer, in which a plurality of emitting devices are disposed; and
   a sensing layer disposed under the thin-film transistor layer, the sensing layer comprising:
   a plurality of sensing pixel electrodes disposed on a bottom surface of the thin-film transistor layer;
   a piezoelectric material disposed under the plurality of sensing pixel electrodes; and
   a sensing common electrode disposed under the piezoelectric material, and
   wherein at least one of the plurality of first thin-film transistors is electrically coupled to the plurality of sensing pixel electrodes, and at least one of the plurality of the second thin-film transistors is electrically coupled to the plurality of emitting devices.

2. The display panel according to claim 1, wherein the bottom surface of the thin-film transistor layer includes a plurality of concave portions, and the plurality of sensing pixel electrodes are disposed in the plurality of concave portions.

3. The display panel according to claim 2, wherein bottom surfaces of the plurality of sensing pixel electrodes are located on a same plane as the bottom surface of the thin-film transistor layer except for parts in which the plurality of concave portions are disposed.

4. The display panel according to claim 1, wherein the plurality of sensing pixel electrodes are electrically coupled to first gate electrodes of the plurality of first thin-film transistors.

5. The display panel according to claim 4, wherein the plurality of sensing pixel electrodes are electrically coupled to the first gate electrodes through holes included in an insulation layer disposed under the first gate electrodes.

6. The display panel according to claim 4, wherein the plurality of sensing pixel electrodes are electrically coupled to the first gate electrodes through holes included in insulation layers disposed under the first gate electrodes and a partial insulation layer disposed on the first gate electrodes.

7. The display panel according to claim 4, further comprising: connection electrodes each having one end coupled to one of the plurality of sensing pixel electrodes and another end coupled to a first gate electrode of one of the plurality of first thin-film transistors.

8. The display panel according to claim 7, wherein at least one of the connection electrodes is disposed separately from a first source electrode and a first drain electrode of the one of the plurality of first thin-film transistors.

9. The display panel according to claim 7, wherein at least one of the connection electrodes is formed of a same material as at least one of the first gate electrode, a first source electrode, or a first drain electrode of the one of the plurality of first thin-film transistors.

10. The display panel according to claim 1, wherein the thin-film transistor layer comprises:
   a first thin-film transistor layer in which the plurality of first thin-film transistors are disposed; and a second thin-film transistor layer disposed between the first thin-film transistor layer and the display layer, in which the plurality of second thin-film transistors are disposed.

11. The display panel according to claim 1, wherein at least one of the plurality of first thin-film transistors is electrically coupled between a driving voltage line electrically coupled to at least one of the plurality of second thin-film transistors and a sensing line.

12. The display panel according to claim 1, wherein the sensing common electrode receives an alternating current (AC) signal in a first period and a direct current (DC) signal in a second period, and
the sensing pixel electrodes receive the DC signal at a level turning off the first thin-film transistors in the first period and is in a floating state in the second period.

13. The display panel according to claim 12, wherein the plurality of emitting devices are driven in at least a part of the first period or the second period.

14. A display device comprising:
the display panel according to claim 1, wherein the display panel includes a plurality of display pixels and a plurality of sensing pixels; and
a sensing driver circuit driving the plurality of sensing pixels included in the display panel.

15. A display panel comprising:
a plurality of display pixels; and
a plurality of sensing pixels disposed in at least a part of an area overlapping with the plurality of display pixels,
wherein each of the plurality of sensing pixels includes at least one first thin-film transistor, and a piezoelectric device disposed in a different layer from the first thin-film transistor and electrically coupled to the first thin-film transistor,
wherein each of the plurality of display pixels includes at least one second thin-film transistor, and an emitting device disposed in a different layer from the second thin-film transistor and electrically coupled to the second thin-film transistor, and
wherein the first thin-film transistor and the second thin-film transistor are disposed between the layer in which the piezoelectric device is disposed and the layer in which the emitting device is disposed.

16. The display panel according to claim 15, wherein the piezoelectric device comprises:
a sensing pixel electrode electrically coupled to a first gate electrode of the first thin-film transistor;
a sensing common electrode generating capacitance with the sensing pixel electrode; and
a piezoelectric material disposed between the sensing pixel electrode and the sensing common electrode.

17. The display panel according to claim 16, wherein the sensing pixel electrode is disposed in a concave portion included on a bottom surface of an insulation layer disposed under the first thin-film transistor, and a bottom surface of the sensing pixel electrode is located on a same plane as the bottom surface of the insulation layer except for a part in which the concave portion is disposed.

18. The display panel according to claim 16, wherein the sensing pixel electrode or the sensing common electrode receives an alternating current (AC) signal in a first period, and the sensing pixel electrode is in a floating state in a second period.

19. The display panel according to claim 15, wherein the first thin-film transistor and the second thin-film transistor are disposed in different layers.

20. The display panel according to claim 15, wherein the first thin-film transistor is electrically coupled between a driving voltage line electrically coupled to the second thin-film transistor and a sensing line.

* * * * *